(12) United States Patent
Murakami et al.

(10) Patent No.: US 8,399,163 B2
(45) Date of Patent: Mar. 19, 2013

(54) METHOD OF DETECTING ALIGNMENT MARK AND METHOD OF MANUFACTURING PRINTED CIRCUIT BOARD

(75) Inventors: Kousuke Murakami, Ibaraki (JP); Akira Arima, Ibaraki (JP); Tomohiro Hattori, Ibaraki (JP); Shuuhei Miyazaki, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 170 days.

(21) Appl. No.: 13/085,251

(22) Filed: Apr. 12, 2011

(65) Prior Publication Data

US 2011/0262868 A1    Oct. 27, 2011

(30) Foreign Application Priority Data

Apr. 22, 2010   (JP) .................................. 2010-098491

(51) Int. Cl.
*G03F 9/00* (2006.01)

(52) U.S. Cl. ............................. 430/22; 430/30; 430/311

(58) Field of Classification Search .................... 430/22, 430/30, 311
See application file for complete search history.

(56) References Cited

U.S. PATENT DOCUMENTS 5,198,857 A    3/1993   Goto

FOREIGN PATENT DOCUMENTS

| JP | 03289662 A | 12/1991 |
| JP | 05323621 A | 12/1993 |
| JP | 2886675 B2 | 4/1999 |

*Primary Examiner* — Christopher Young
(74) *Attorney, Agent, or Firm* — Panitch Schwarze Belisario & Nadel LLP

(57) ABSTRACT

When an alignment mark does not exist within an area of an image obtained by a camera, the coordinate of the alignment mark is calculated based on an identification mark existing in the area of the image and a previously stored positional relationship between the alignment mark and the identification mark. A distance by which a long-sized base material is to be moved for causing the alignment mark to be positioned within the imaging area of the camera is calculated based on the calculated coordinate of the alignment mark, and the long-sized base material is moved by the calculated distance.

7 Claims, 16 Drawing Sheets

F I G. 4
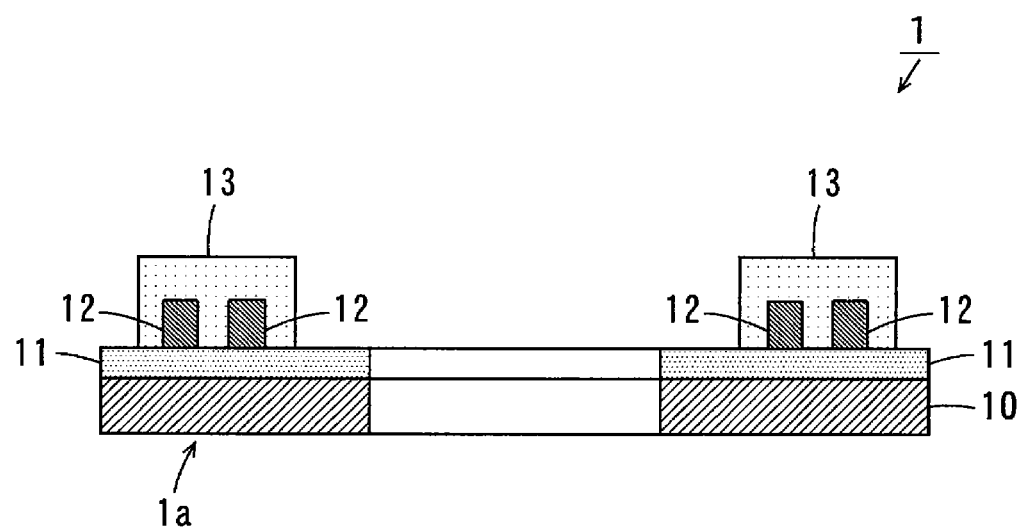

F I G. 5
(a) 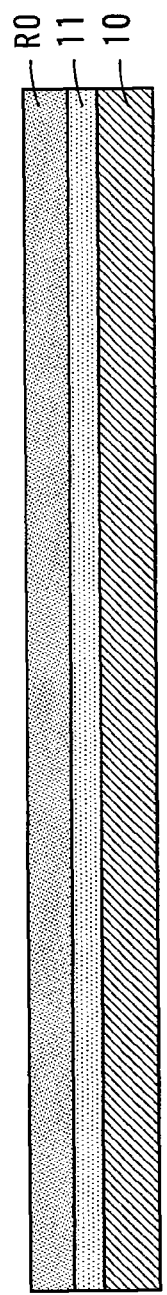
(b) 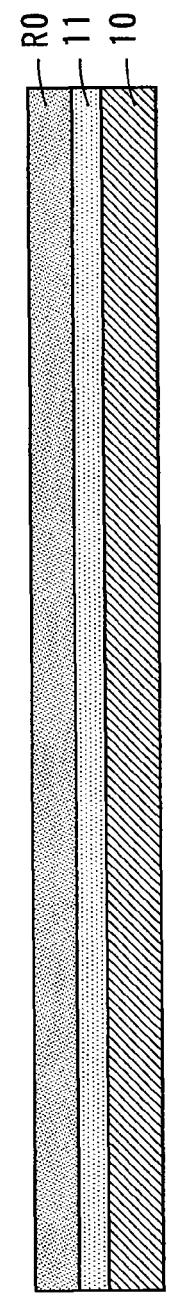

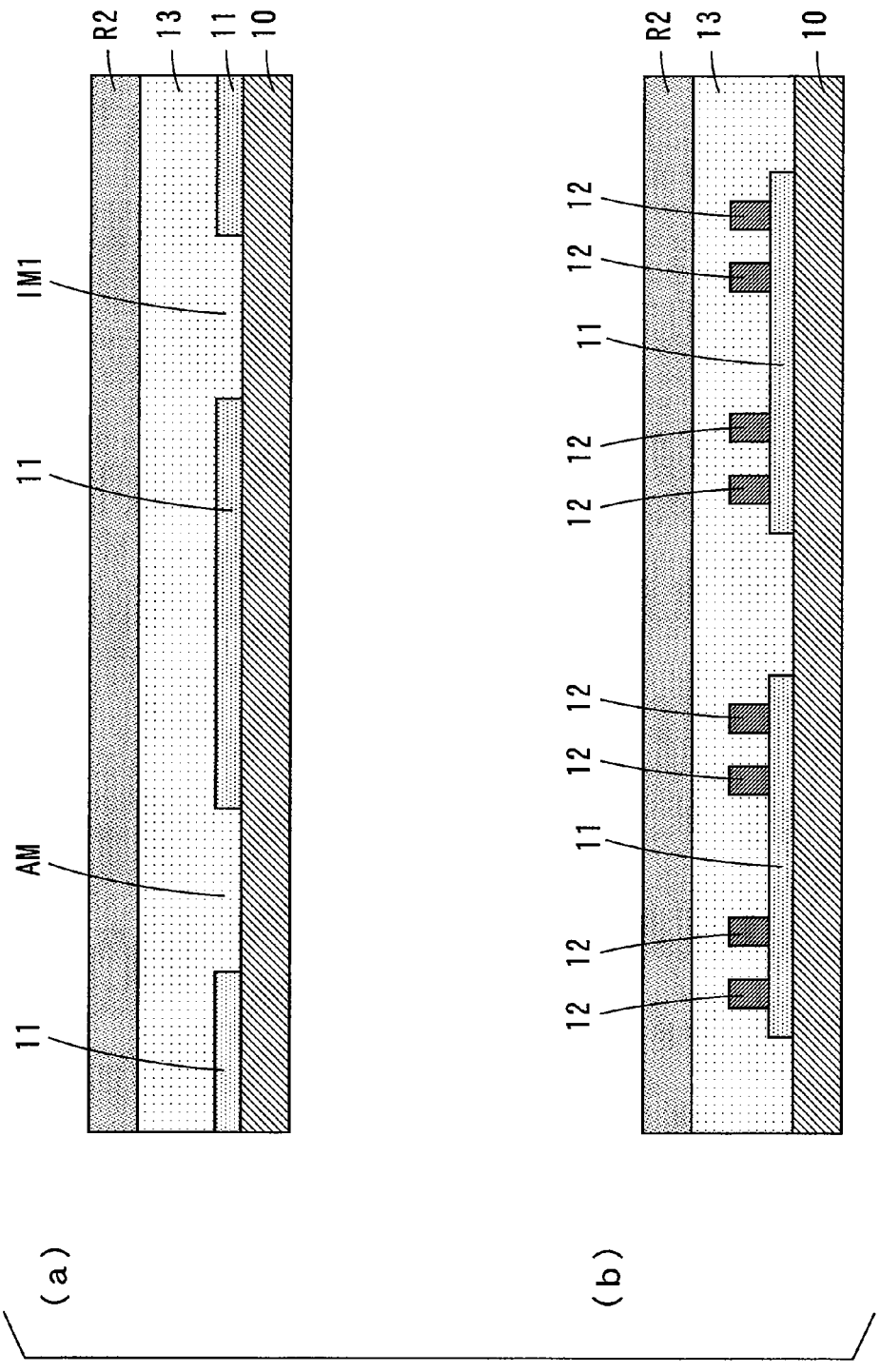
F I G. 11

FIG. 13
(a)
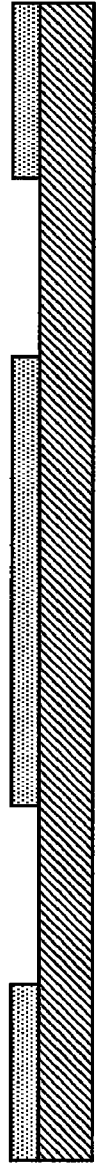
(b)
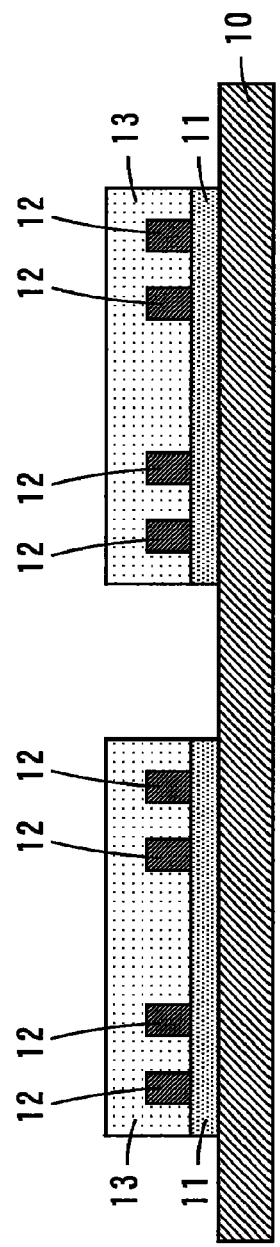

METHOD OF DETECTING ALIGNMENT MARK AND METHOD OF MANUFACTURING PRINTED CIRCUIT BOARD

BACKGROUND OF THE INVENTION

1. Field of the Invention

The present invention relates to a method of detecting an alignment mark for aligning a photomask during exposure processing and a method of manufacturing a printed circuit board including the exposure processing.

2. Description of the Background Art

In a printed circuit board, a conductor layer having a given pattern is formed on an insulating layer. Application of a photosensitive resist (hereinafter abbreviated as a resist), exposure processing and development processing for patterning the conductor layer, for example, are performed in manufacturing steps of the printed circuit board. The resist is applied on the conductor layer, thereby forming a resist layer on the conductor layer, for example. In the exposure processing, a surface of the resist layer is irradiated with light through a photomask. Thus, the resist layer is exposed in a pattern of the photomask. The development processing is then performed, so that the resist layer having the given pattern (hereinafter referred to as a resist pattern) is formed on the conductor layer.

In this state, a region of the conductor layer excluding a region below the resist pattern is removed by etching, for example, and the resist pattern is subsequently removed. In this manner, the conductor layer is formed in the given pattern.

During the foregoing exposure processing, it is necessary to detect a region to be exposed (hereinafter referred to as an exposure region) of the resist layer on a base material such as the conductor layer, and align the photomask with the exposure region. For aligning the photomask, an alignment mark for exposure is provided in the base material, and the photomask is aligned based on the alignment mark (see JP 2886675 B, for example).

When the photomask is aligned in the foregoing exposure processing, the base material is photographed by a camera, and an image including the alignment mark is processed, so that a position of the alignment mark is detected.

In this case, the alignment mark needs to exist within an area of the image obtained by the camera. Usually, the base material is transported such that the alignment mark for the current exposure processing exists within the area of the image based on information related to the position of the base material in the preceding exposure processing. However, the alignment mark may not exist within the area of the image obtained by the camera or only part of the alignment mark may exist within the area of the image due to an error in a transport speed or the like.

In such a case, it is necessary to move the base material by a transport device, photograph the base material by the camera and search for the alignment mark on the image in a repetitive manner until the alignment mark exists within the area of the image obtained by the camera. Therefore, detection of the alignment mark takes time, resulting in a longer time required for the exposure processing.

When the imaging area is extended by lowering the imaging magnification of the camera, the alignment mark more easily exists within the area of the image. In this case, however, the detection accuracy of the position of the alignment mark is reduced, thus leading to lower detection accuracy of the exposure region. This results in lower alignment accuracy of the photomask.

BRIEF SUMMARY OF THE INVENTION

An object of the present invention is to provide a method of detecting an alignment mark and a method of manufacturing a printed circuit board capable of reducing time required for detecting a position of the alignment mark without reducing detection accuracy of the position of the alignment mark.

(1) According to one aspect of the present invention, a method of detecting an alignment mark for aligning a photomask with an exposure region of a base material when the base material is subjected to exposure processing, wherein the base material has the alignment mark, and has a mark for searching in a different position from a position of the alignment mark, and the method includes the steps of previously storing a positional relationship between the alignment mark and the mark for searching, acquiring an image of the base material as a first image by photographing the base material by an imaging device, calculating a distance by which the base material is to be moved for causing the alignment mark to exist within an imaging area of the imaging device based on the position of the mark for searching in the first image and the stored positional relationship when the alignment mark does not exist and the mark for searching exists in the acquired first image, moving the base material by the calculated distance, and acquiring an image of the base material as a second image by the imaging device after the base material is moved, and detecting the position of the alignment mark that exists in the acquired second image.

In the method of detecting the alignment mark, the positional relationship between the alignment mark and the mark for searching is previously stored. First, the base material is photographed by the imaging device, so that the image of the base material is acquired as the first image. When the mark for searching exists while the alignment mark does not exist in the acquired first image, the distance by which the base material is to be moved for causing the alignment mark to exist within the imaging area of the imaging device is calculated based on the position of the mark for searching in the first image and the stored positional relationship. Next, the base material is moved by the calculated distance. After the base material is moved, the image of the base material is acquired by the imaging device as the second image, and the position of the alignment mark existing in the acquired second image is detected.

This allows the position of the alignment mark to be detected without reducing an imaging magnification of the imaging device and repeatedly moving the base material. Accordingly, time required for detecting the position of the alignment mark can be reduced without reducing detection accuracy of the position of the alignment mark.

(2) According to another aspect of the present invention, a method of manufacturing a printed circuit board including exposure processing for patterning any layer of a base material including a plurality of layers includes the steps of forming in the base material an alignment mark for aligning a photomask in an exposure device, forming a mark for searching in a different position from a position of the alignment mark of the base material, previously storing a positional relationship between the alignment mark and the mark for searching, and performing the exposure processing on the any layer of the base material, wherein the step of performing the exposure processing includes the steps of acquiring an image of the base material as a first image by photographing the base material by an imaging device, calculating a distance by which the base material is to be moved for causing the alignment mark to exist within an imaging area of the imaging device based on the position of the mark for searching in the first image and the stored positional relationship when the alignment mark does not exist and the mark for searching exists in the acquired first image, moving the base material by the calculated distance, and acquiring an image of the base material as a second image by the imaging device after the base material is moved, detecting the position of the alignment mark that exists in the acquired second image, and applying the detected position of the alignment mark to the exposure device.

In the method of manufacturing the printed circuit board, the alignment mark for aligning the photomask in the exposure device is formed in the base material. The mark for searching is formed in the position different from the position of the alignment mark of the base material. The positional relationship between the alignment mark and the mark for searching is previously stored.

When the exposure processing is performed on the any layer of the base material, first, the base material is photographed by the imaging device, so that the image of the base material is acquired as the first image. When the mark for searching exists while the alignment mark does not exist in the acquired first image, the distance by which the base material is to be moved for causing the alignment mark to exist within the imaging area of the imaging device is calculated based on the position of the mark for searching in the first image and the stored positional relationship. Next, the base material is moved by the calculated distance. After the base material is moved, the image of the base material is acquired by the imaging device as the second image, and the position of the alignment mark existing in the acquired second image is detected. The detected position of the alignment mark is applied to the exposure device. In the exposure device, the photomask is aligned based on the applied position of the alignment mark.

This allows the position of the alignment mark to be detected without reducing an imaging magnification of the imaging device and repeatedly moving the base material. Accordingly, time required for detecting the position of the alignment mark can be reduced without reducing detection accuracy of the position of the alignment mark. This results in shorter manufacturing time of the printed circuit board.

(3) The mark for searching may include an identification mark for identifying the photomask to be used in the exposure processing.

In this case, since the identification mark for identifying the photomask is used as the mark for searching, a mark need not be separately formed as the mark for searching. Accordingly, the alignment mark can be detected in a shorter time without increasing the number of manufacturing steps of the printed circuit board.

(4) The printed circuit board may include a first insulating layer, a conductor layer and a second insulating layer in this order, and the base material may include at least a photosensitive resist layer, and the exposure processing may be performed on the photosensitive resist layer for patterning at least one of the first insulating layer, the conductor layer and the second insulating layer.

In this case, time for patterning the at least one of the first insulating layer, the conductor layer and the second insulating layer is reduced. Accordingly, the manufacturing time of the printed circuit board is reduced.

(5) The base material may include at least the first insulating layer, and the mark for searching may include a first identification mark corresponding to a first photomask to be used in the exposure processing for patterning the conductor layer.

In this case, the first identification mark corresponding to the first photomask to be used in the exposure processing for patterning the conductor layer is used as the mark for searching. Therefore, a mark need not be separately formed as the mark for searching. Accordingly, the alignment mark can be detected in a shorter time without increasing the number of manufacturing steps of the printed circuit board.

(6) The base material may include at least the first insulating layer and the conductor layer, and the mark for searching may include a second identification mark corresponding to a second photomask to be used in the exposure processing for patterning the second insulating layer.

In this case, the second identification mark corresponding to the second photomask to be used in the exposure processing for patterning the second insulating layer is used as the mark for searching. Therefore, a mark need not be separately formed as the mark for searching. Accordingly, the alignment mark can be detected in a shorter time without increasing the number of manufacturing steps of the printed circuit board.

(7) The alignment mark may have a first shape, and the mark for searching may have a second shape that is different from the first shape.

In this case, the alignment mark and the mark for searching can be easily identified. Accordingly, the alignment mark can be accurately detected in a shorter time.

According to the present invention, the position of the alignment mark can be detected without reducing the imaging magnification of the imaging device and repeatedly moving the base material. Accordingly, the time required for detecting the position of the alignment mark can be reduced without reducing the detection accuracy of the position of the alignment mark.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWINGS

FIG. 4 is a sectional view of the suspension board taken along the line A-A of FIG. 3;

FIGS. 5 (a), (b) are sectional views illustrating a step in one example of a method of manufacturing the suspension board according to the present embodiment;

FIGS. 11 (a), (b) are sectional views illustrating a step in the one example of the method of manufacturing the suspension board according to the present embodiment;

FIGS. 13 (a), (b) are sectional views illustrating a step in the one example of the method of manufacturing the suspension board according to the present embodiment;

DETAILED DESCRIPTION OF THE INVENTION

Figure 1:
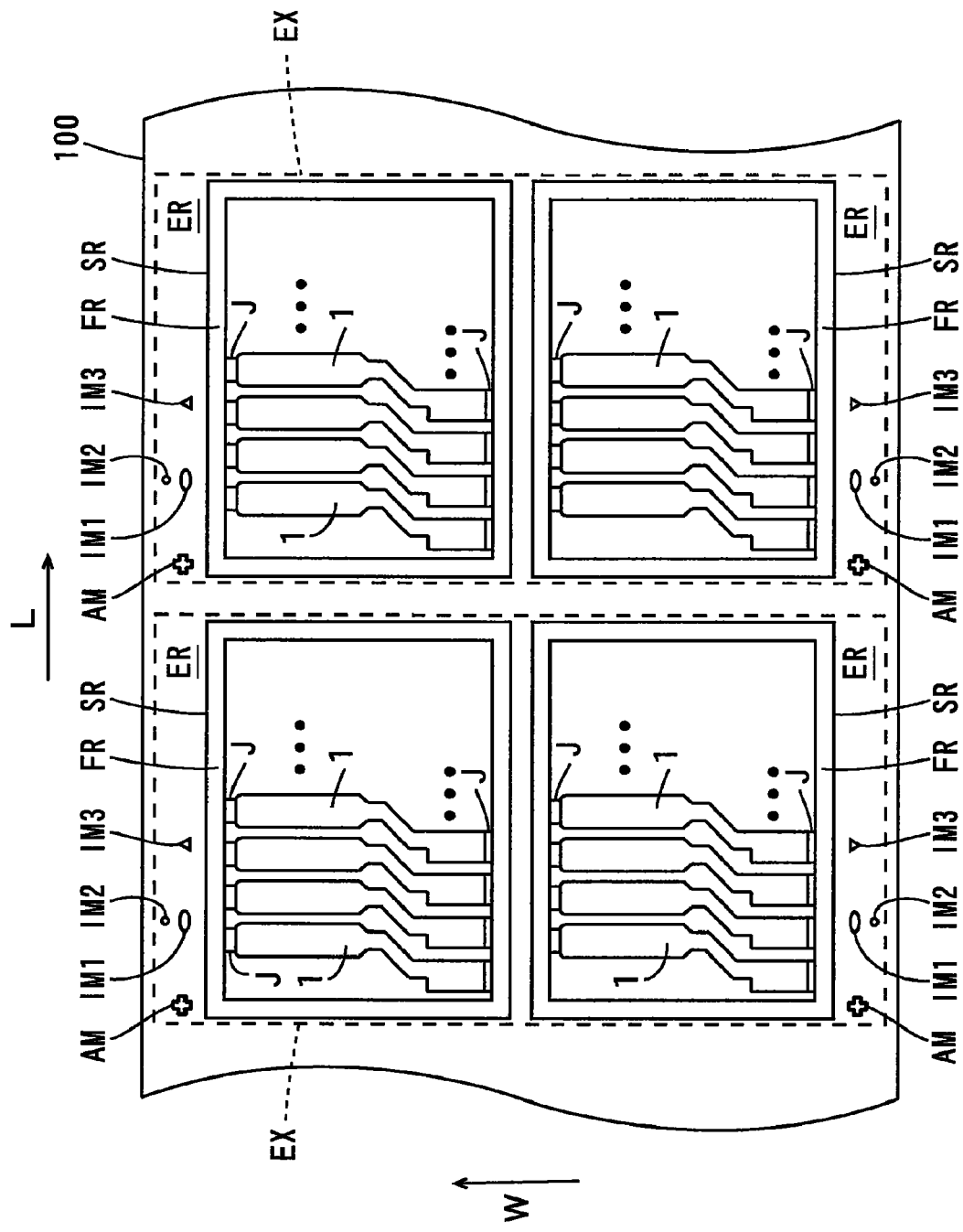
FIG. 1 is a top view of a suspension board assembly sheet according to the present embodiment.

Description will be made of a method of manufacturing a printed circuit board according to one embodiment of the present invention while referring to the drawings. In the present embodiment, a suspension board with circuits (hereinafter referred to as a suspension board) is described as one example of the printed circuit board.

(1) Assembly Sheet

Figure 2:
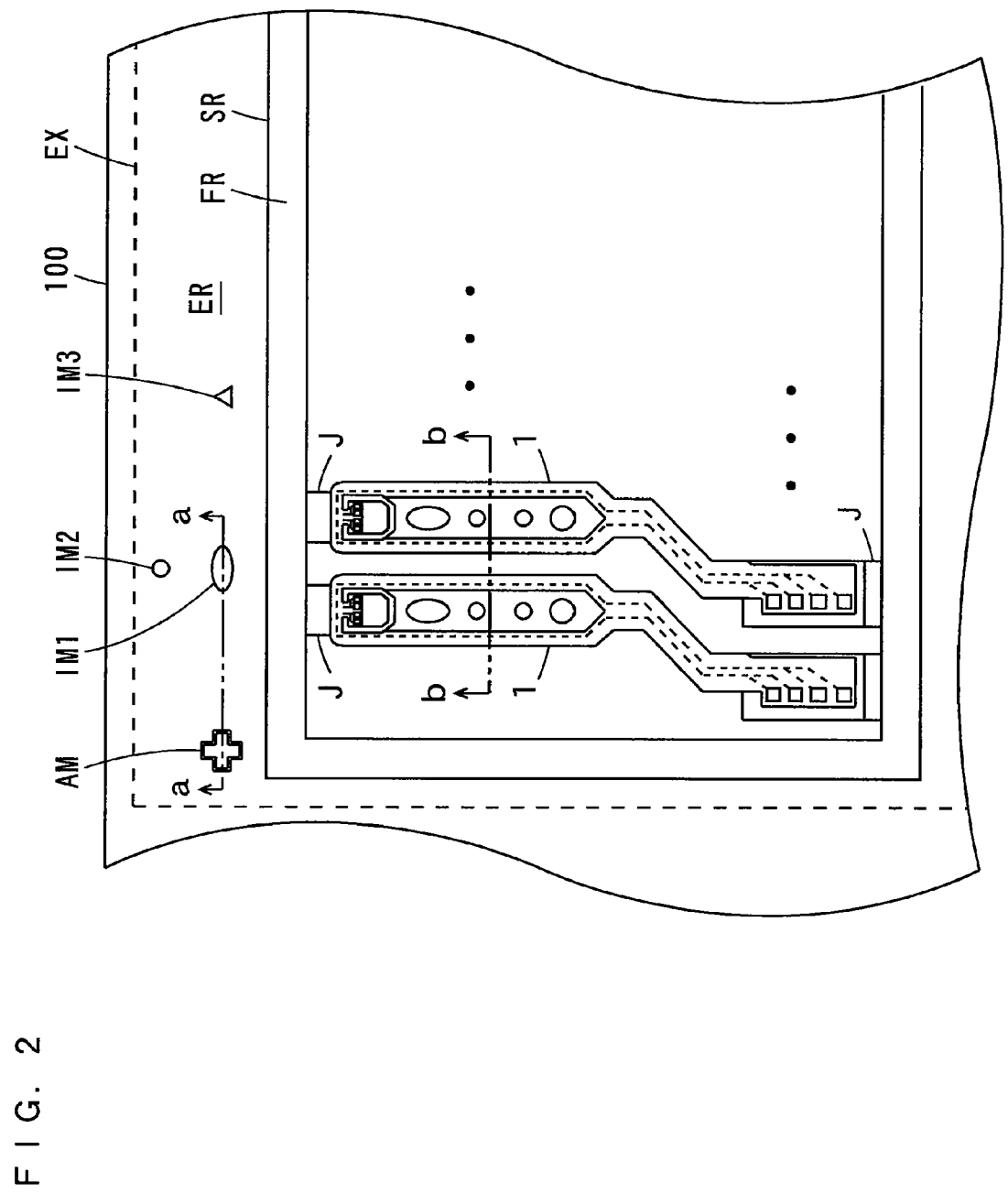
FIG. 2 is a partially enlarged view of the assembly sheet of FIG. 1.

FIG. 1 is a top view of a suspension board assembly sheet (hereinafter referred to as an assembly sheet) according to the present embodiment. FIG. 2 is a partially enlarged view of the assembly sheet of FIG. 1. The assembly sheet refers to a half-finished product in a manufacture process of the suspension board.

In manufacture of the assembly sheet 100 of FIG. 1, a plurality of layers each having a given pattern are formed on a long-sized base material while the long-sized base material is transported in its longitudinal direction by a roll-to-roll system. Patterning of each of the layers is performed by formation of a resist layer, exposure processing, development processing, plating processing, etching and so on. Details of manufacturing steps of the suspension board will be described below.

In FIG. 1, the long-sized assembly sheet 100 is transported in the longitudinal direction L. A plurality of quadrangular substrate formation regions SR are formed in two rows along the longitudinal direction L in the assembly sheet 100. Each of the substrate formation regions SR has a frame FR. A plurality of long-sized suspension boards 1 are formed inside the frame FR. Both ends of each suspension board 1 are coupled to the frame FR by coupling portions J (see FIG. 2). The coupling portions J are cut in the final stage of the manufacturing steps, so that each suspension board 1 is separated from the frame FR.

The above-mentioned exposure processing of the resist layer is performed for each exposure region EX surrounded by the dotted line. The exposure region EX corresponds to a patterning region of a photomask to be used in the exposure processing. Each exposure region EX includes two substrate formation regions SR arranged in a width direction W of the assembly sheet 100, and includes side regions ER arranged between both lateral sides of the assembly sheet 100 and the substrate formation regions SR. The number of the substrate formation regions SR included in each exposure region EX is not limited to two. Each exposure region EX may include one substrate formation region SR, or may include three or more substrate formation regions SR.

An alignment mark AM and a plurality of identification marks IM1, IM2, IM3 are formed in each of the side regions ER on outer sides of the substrate formation regions SR. The alignment mark AM is used for aligning the photomask with the exposure region EX during the exposure processing. The relative positional relationship between the alignment mark AM and the exposure region EX is predetermined. The identification marks IM1, IM2, IM3 are used for identifying the photomasks to be used for patterning the layers.

Here, description is made of an example in which first, second and third photomasks are used for patterning three kinds of layers. Alignment marks corresponding to the alignment mark AM of the assembly sheet 100 (more precisely, the base material in the manufacturing process of the assembly sheet 100) are formed in the first, second and third photomasks. In an exposure device, the alignment marks of the first, second and third photomasks are aligned with the alignment mark AM of the assembly sheet 100, thereby accurately aligning the first, second and third photomasks with the exposure region EX.

An identification mark corresponding to the identification mark IM1 of the assembly sheet 100 is formed in the first photomask, an identification mark corresponding to the identification mark IM2 of the assembly sheet 100 is formed in the second photomask, and an identification mark corresponding to the identification mark IM3 of the assembly sheet 100 is formed in the third photomask. In the present embodiment, the alignment mark AM has a cross shape, and the identification marks IM1, IM2, IM3 have an elliptical shape, a round shape and a triangular shape, respectively.

The identification marks IM1, IM2, IM3 may have enough sizes to be recognized by the shapes, because they are not originally used for aligning the photomasks.

(2) The Configuration of the Suspension Board

Figure 3:
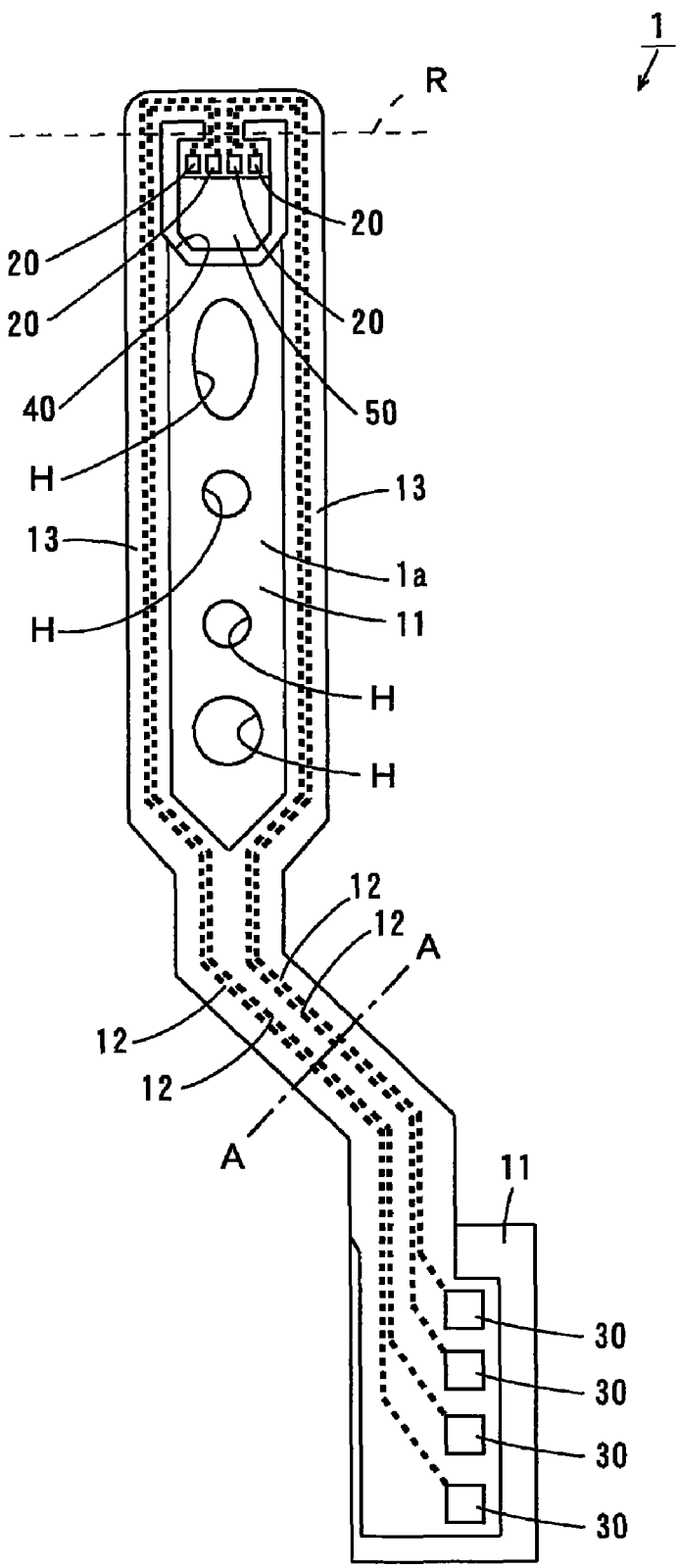
FIG. 3 is a plan view of a suspension board.

FIG. 3 is a plan view of the suspension board, and FIG. 4 is a sectional view of the suspension board taken along the line A-A of FIG. 3.

As shown in FIG. 3, the suspension board 1 includes a suspension body 1a composed of a support substrate 10 (see FIG. 4) and a base insulating layer 11 described below. At one tip of the suspension body 1a, a U-shaped opening 40 is formed, thereby providing a magnetic head supporting portion (hereinafter referred to as a tongue) 50. The tongue 50 is bent along the broken line R to form a given angle with respect to the suspension body 1a.

Four electrode pads 20 are formed at an end of the tongue 50. Four electrode pads 30 are formed at the other tip of the suspension body 1a. The four electrode pads 20 on the tongue 50 and the four electrode pads 30 at the other tip of the suspension body 1a are electrically connected to one another through a conductor layer 12 in the shape of four lines, which are wiring traces. A plurality of holes H are formed in the suspension body 1a. The conductor layer 12 in the shape of the four lines is covered with a cover insulating layer 13.

As shown in FIG. 4, the base insulating layer 11 made of polyimide is formed on the support substrate 10 made of stainless steel in the cross section taken along the line A-A of FIG. 3. The conductor layer 12 in the shape of four lines made of copper is formed on the base insulating layer 11. The cover insulating layer 13 made of polyimide is formed to cover the conductor layer 12 in the shape of the four lines.

(3) Method of Manufacturing the Suspension Board

Next, description will be made of a method of manufacturing the suspension board 1. FIGS. 5 to 13 are sectional views illustrating steps in one example of the method of manufacturing the suspension board 1 according to the present embodiment. (a) in FIGS. 5 to 13 corresponds to a cross section taken along the line a-a of FIG. 2, and (b) in FIGS. 5 to 13 corresponds to a cross section taken along the line b-b of FIG. 2.

In the example of FIGS. 5 to 13, the first and second photomasks are used for patterning the conductor layer 12 and the cover insulating layer 13, respectively, in the exposure device.

First, as shown in FIG. 5 (a), the base insulating layer 11 made of polyimide is formed on the long-sized support substrate 10 made of stainless steel. A two-layer base material having a layered configuration of the support substrate 10 and the base insulating layer 11 may be used. A photosensitive resist (hereinafter abbreviated as a resist) is applied on the base insulating layer 11, thereby forming a resist layer R0.

The material for the support substrate 10 is not limited to stainless steel. For example, another metal material such as aluminum (Al) may be used. The thickness of the support substrate 10 is not less than 5 μm and not more than 50 μm, and preferably not less than 10 μm and not more than 30 μm, for example. The material for the base insulating layer 11 is not limited to polyimide. For example, another insulating material such as epoxy may be used. The thickness of the base insulating layer 11 is not less than 3 μm and not more than 20 μm, and preferably not less than 5 μm and not more than 15 μm, for example.

Figure 6:
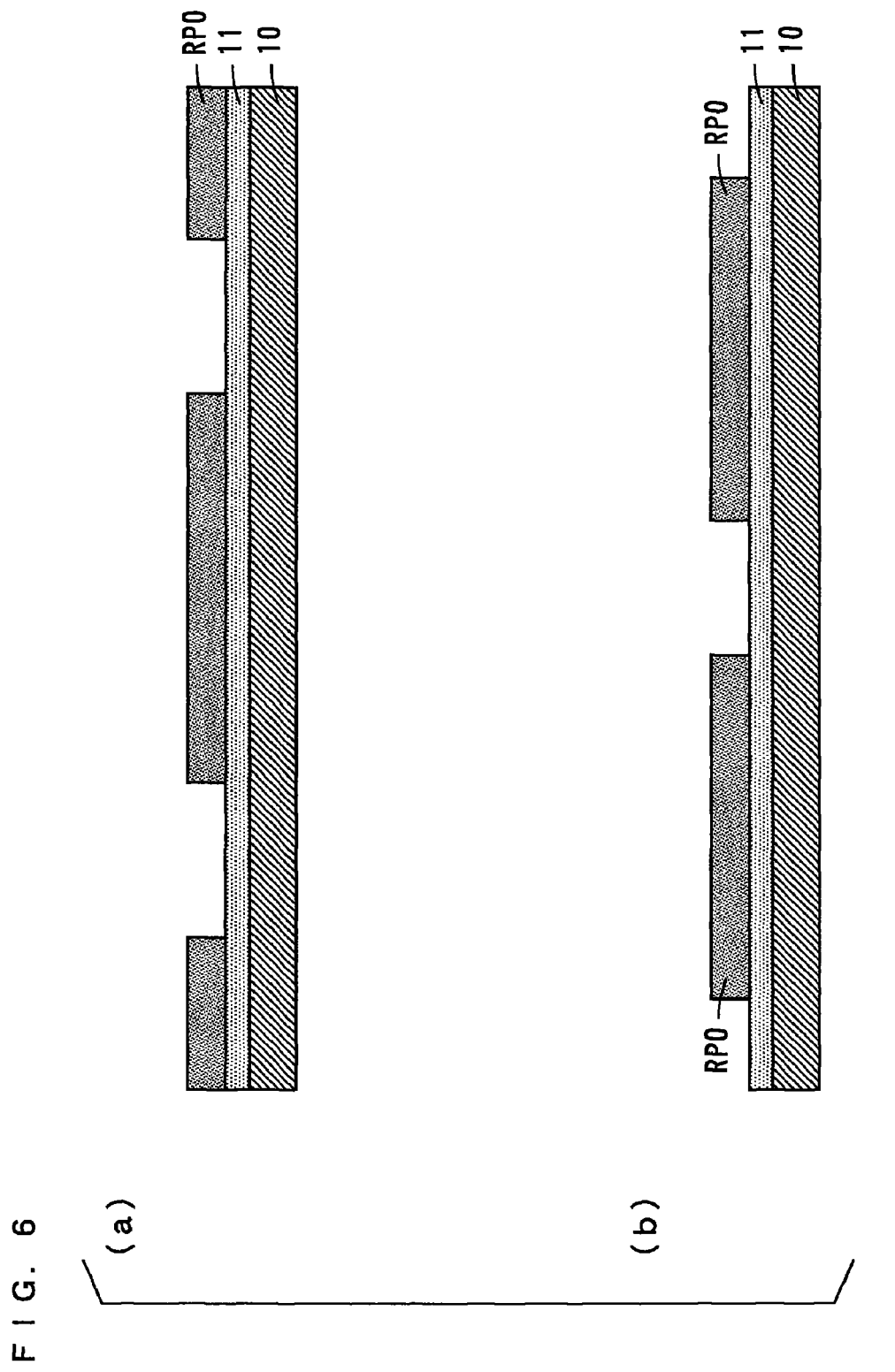
FIGS. 6 (a), (b) are sectional views illustrating a step in the one example of the method of manufacturing the suspension board according to the present embodiment.

As shown in FIG. 6, a resist pattern RP0 for patterning the base insulating layer 11 is subsequently formed by subjecting the resist layer R0 to exposure processing and development processing. In the resist pattern RP0, a region excluding a region corresponding to the base insulating layer 11 of the suspension board 1 of FIG. 2 is removed, and regions corresponding to the alignment mark AM and the identification marks IM1, IM2, IM3 are removed.

Figure 7:
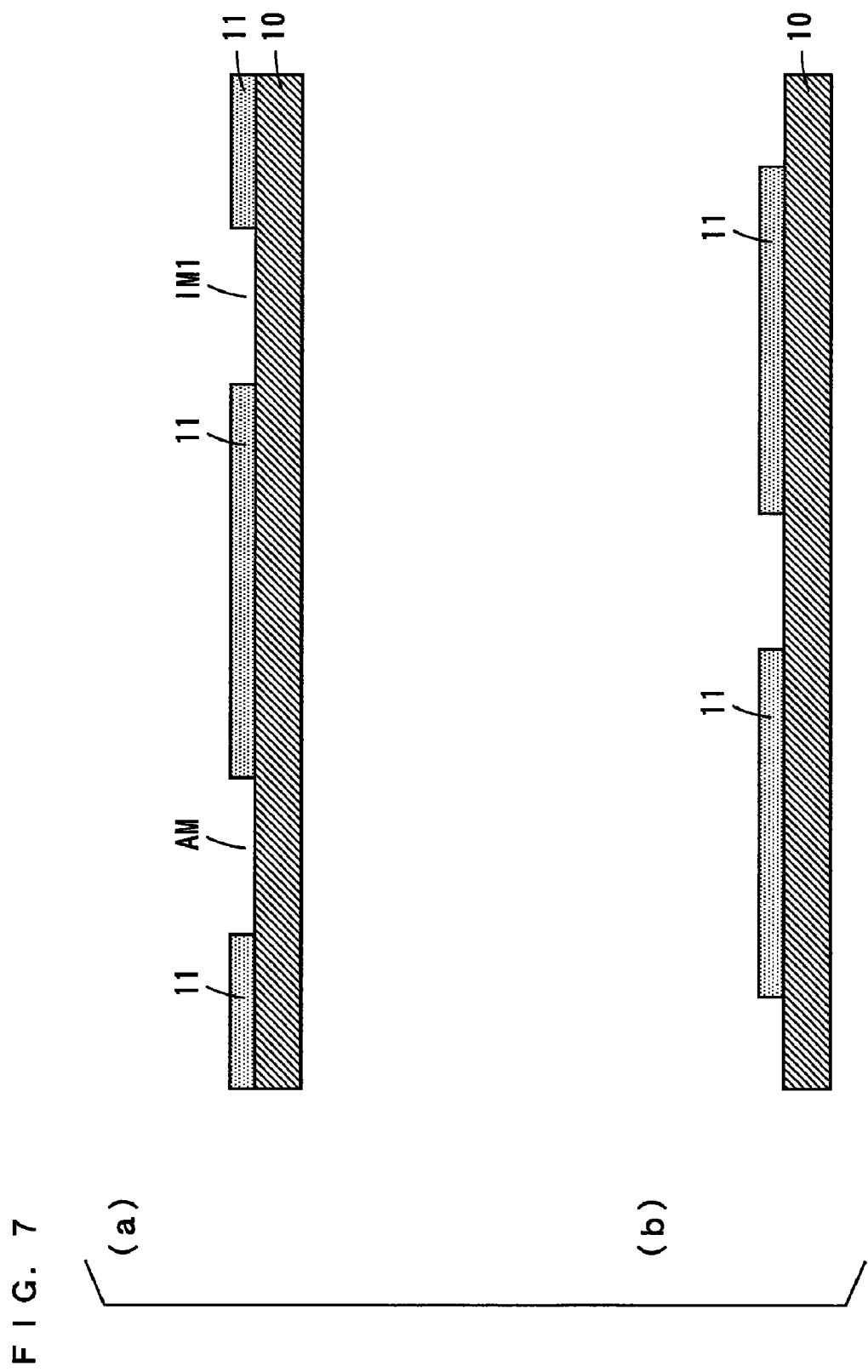
FIGS. 7 (a), (b) are sectional views illustrating a step in the one example of the method of manufacturing the suspension board according to the present embodiment.

After a region of the base insulating layer 11 excluding a region below the resist pattern RP0 is removed by etching, the resist pattern RP0 is removed using a stripping liquid. Thus, the base insulating layer 11 is formed in the given pattern as shown in FIG. 7. The alignment mark AM and the identification marks IM1, IM2, IM3 formed of respective openings are formed in the side region ER of the base insulating layer 11 of FIG. 2. FIG. 7 (a) shows the alignment mark AM and the identification mark IM1. FIG. 7 (b) shows the base insulating layer 11 corresponding to two suspension boards 1.

While the alignment mark AM and the identification marks IM1, IM2, IM3 are formed of the respective openings in the base insulating layer 11 in this example, the base insulating layer 11 itself may be formed to have the shapes of the alignment mark AM and the identification marks IM1, IM2, IM3.

Figure 8:
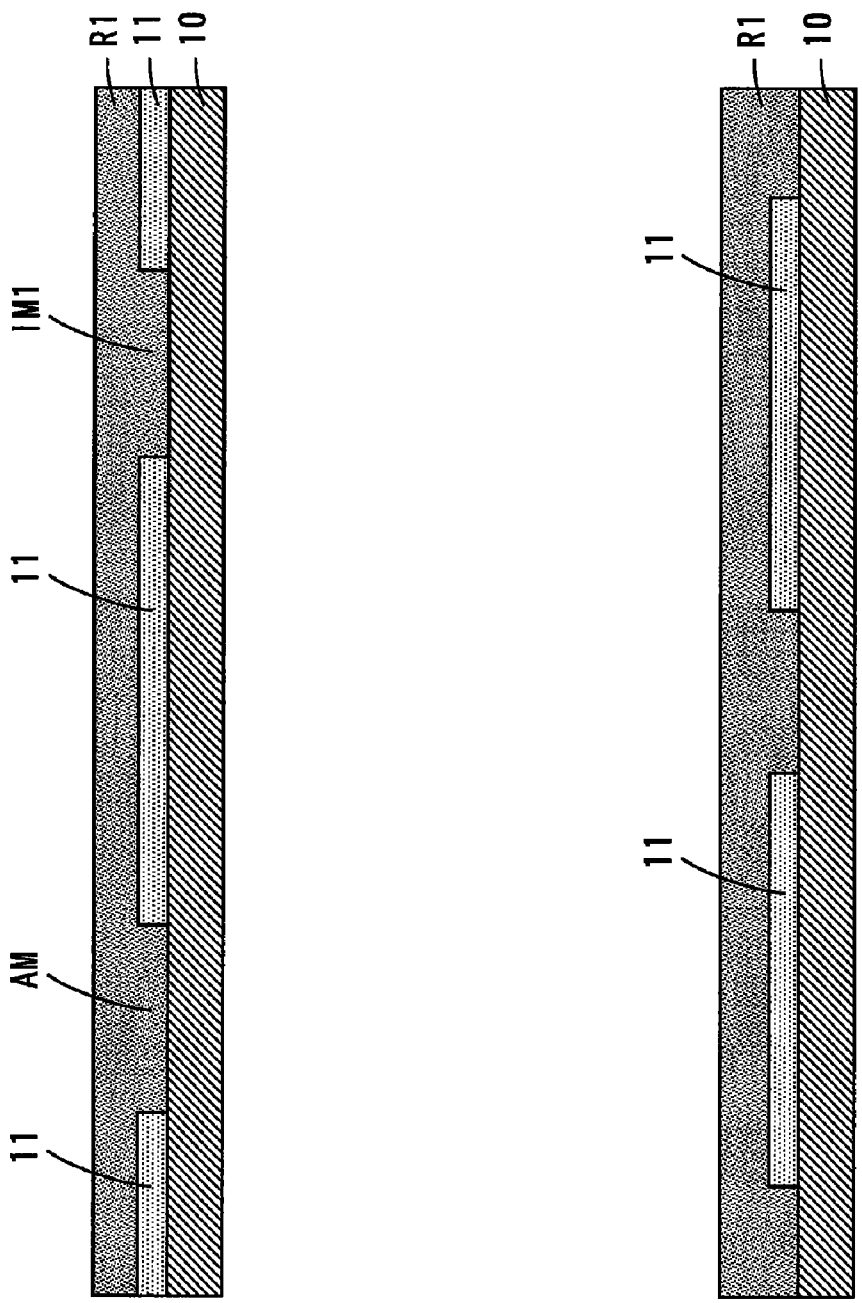
FIGS. 8 (a), (b) are sectional views illustrating a step in the one example of the method of manufacturing the suspension board according to the present embodiment.

Then, a resist is applied on the exposed support substrate 10 and the base insulating layer 11, thereby forming a resist layer R1 as shown in FIG. 8.

Figure 9:
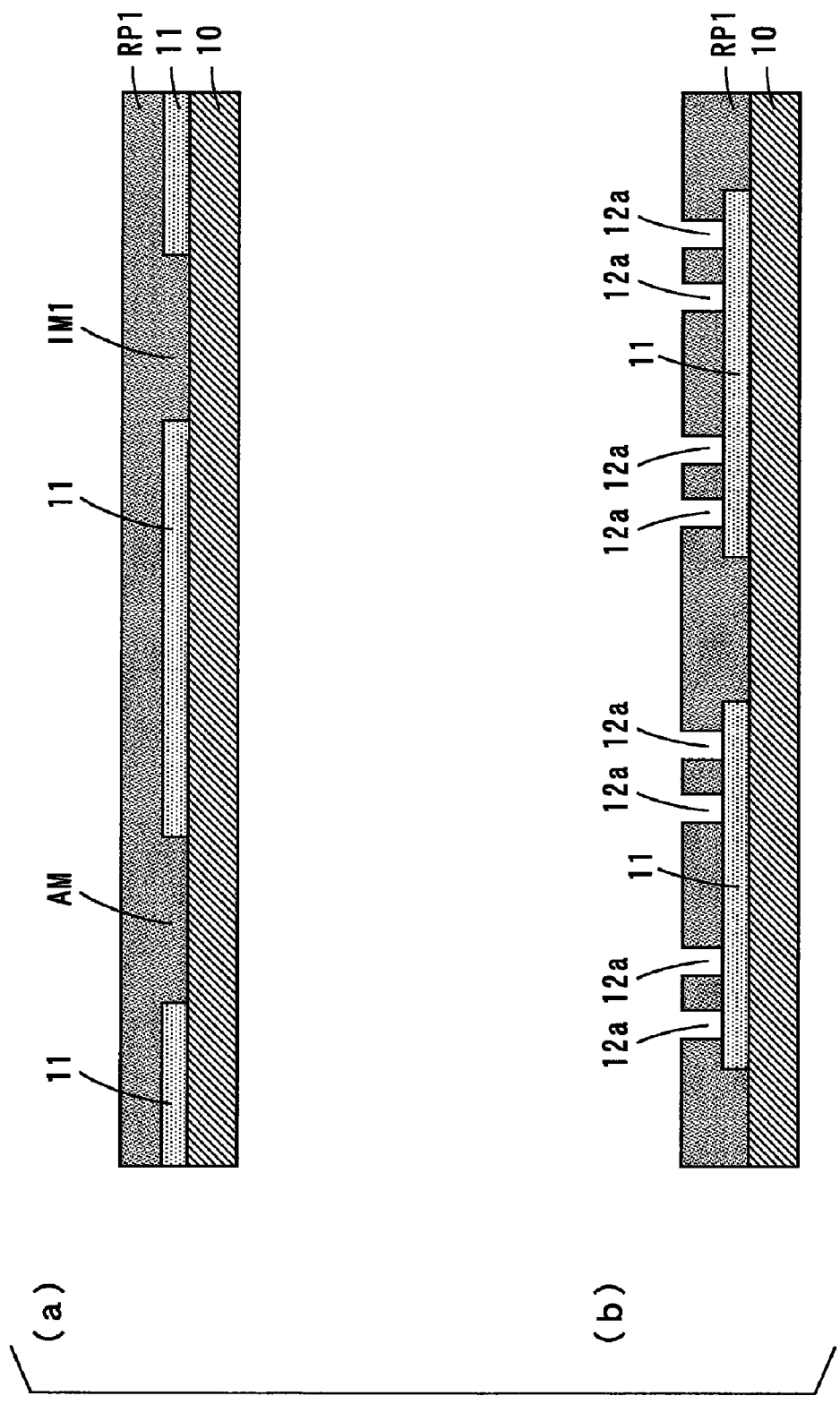
FIGS. 9 (a), (b) are sectional views illustrating a step in the one example of the method of manufacturing the suspension board according to the present embodiment.

Next, the resist layer R1 is subjected to exposure processing and development processing, thereby forming a resist pattern RP1 for patterning the conductor layer 12 as shown in FIG. 9. The first photomask is used in the exposure device during the exposure processing. In this case, the first photomask is confirmed using the identification mark IM1 to be the photomask for patterning the conductor layer 12. The first photomask is aligned using the alignment mark AM. As described below, the position of the support substrate 10 is adjusted using the identification marks IM1, IM2, IM3 such that the alignment mark AM exists within an area of an image obtained by a camera in the present embodiment. Details will be described below.

In the resist pattern RP1, a region 12a corresponding to the conductor layer 12 of the suspension board 1 of FIG. 2 is removed.

Figure 10:
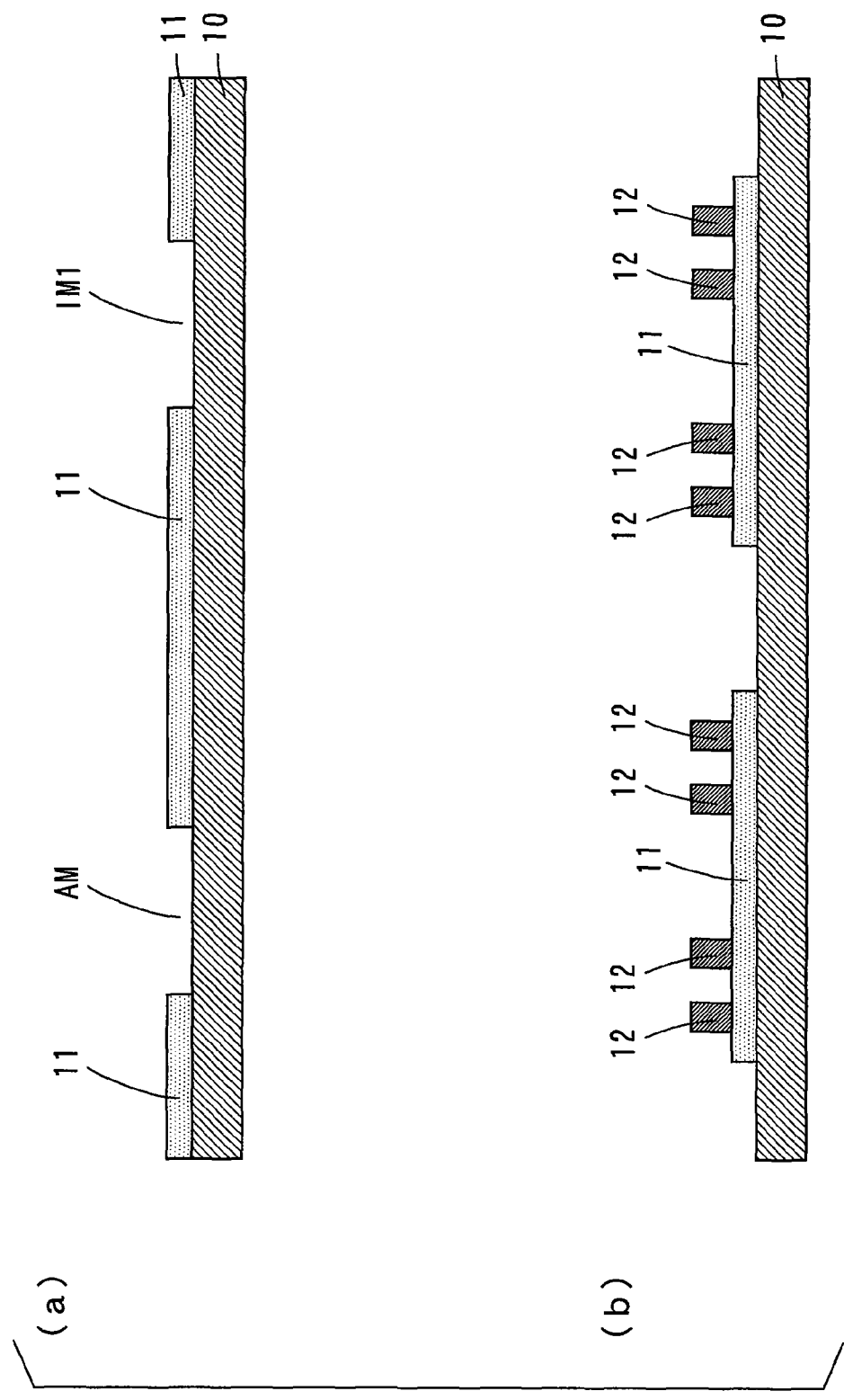
FIGS. 10 (a), (b) are sectional views illustrating a step in the one example of the method of manufacturing the suspension board according to the present embodiment.

In this state, the conductor layer 12 made of copper is formed in the region 12a by electrolytic plating, and the resist pattern RP1 is then removed using a stripping liquid. Accordingly, the conductor layer 12 having the line pattern is formed on the base insulating layer 11 as shown in FIG. 10. Prior to the electrolytic plating, a plating base, which is not shown, is formed.

The material for the conductor layer 12 is not limited to copper. For example, another metal such as gold (Au) and aluminum or an alloy such as a copper alloy and an aluminum alloy may be used. The thickness of the conductor layer 12 is not less than 3 μm and not more than 16 μm, and preferably not less than 6 μm and not more than 13 μm, for example. The width of the conductor layer 12 is not less than 12 μm and not more than 60 μm, and preferably not less than 16 μm and not more than 50 μm, for example.

The conductor layer 12 may be formed using an additive method or a semi-additive method, or may be formed using another method such as a subtractive method.

After that, the cover insulating layer 13 made of polyimide is formed on the support substrate 10 to cover the conductor layer 12 and the base insulating layer 11 as shown in FIG. 11. Further, a resist is applied on the cover insulating layer 13, thereby forming a resist layer R2.

Figure 12:
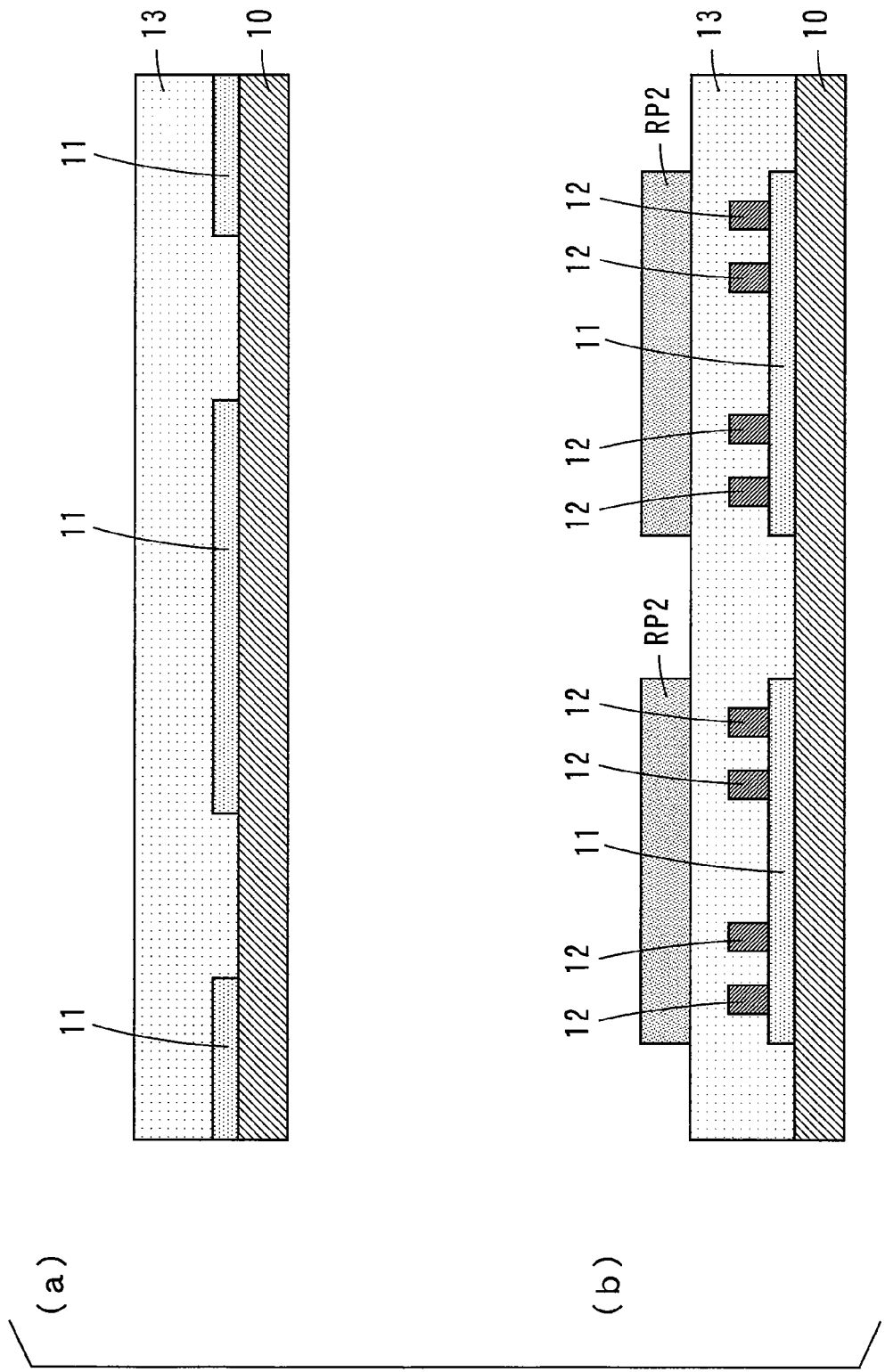
FIGS. 12 (a), (b) are sectional views illustrating a step in the one example of the method of manufacturing the suspension board according to the present embodiment.

Then, the resist layer R2 is subjected to exposure processing and development processing, thereby forming a resist pattern RP2 for patterning the cover insulating layer 13 as shown in FIG. 12. In the resist pattern RP2, a region excluding a region corresponding to the cover insulating layer 13 of the suspension board 1 of FIG. 2 is removed.

The second photomask is used in the exposure device during the exposure processing. In this case, the second photomask is confirmed using the identification mark IM2 to be the photomask for patterning the cover insulating layer 13. The second photomask is aligned using the alignment mark AM. Similarly to the alignment of the first photomask, the position of the support substrate 10 is adjusted using the identification marks IM1, IM2, IM3 such that the alignment mark AM exists within the area of the image obtained by the camera.

After a region of the cover insulating layer 13 excluding a region below the resist pattern RP2 is removed by etching, the resist pattern RP2 is removed using a stripping liquid. Thus, the cover insulating layer 13 is formed in the given pattern as shown in FIG. 13.

The material for the cover insulating layer 13 is not limited to polyimide. For example, another insulating material such as epoxy may be used. The thickness of the cover insulating layer 13 is not less than 5 μm and not more than 30 μm, and preferably not less than 10 μm and not more than 20 μm, for example.

After that, a region of the support substrate 10 excluding a region of the suspension body 1a of FIG. 3 is removed by etching, so that the assembly sheet 100 shown in FIG. 1 is prepared.

Finally, each suspension board 1 is cut off from the frame FR at the coupling portions J of the assembly sheet 100. In this manner, the plurality of suspension boards 1 are completed.

(4) The Exposure Processing

Figure 14:
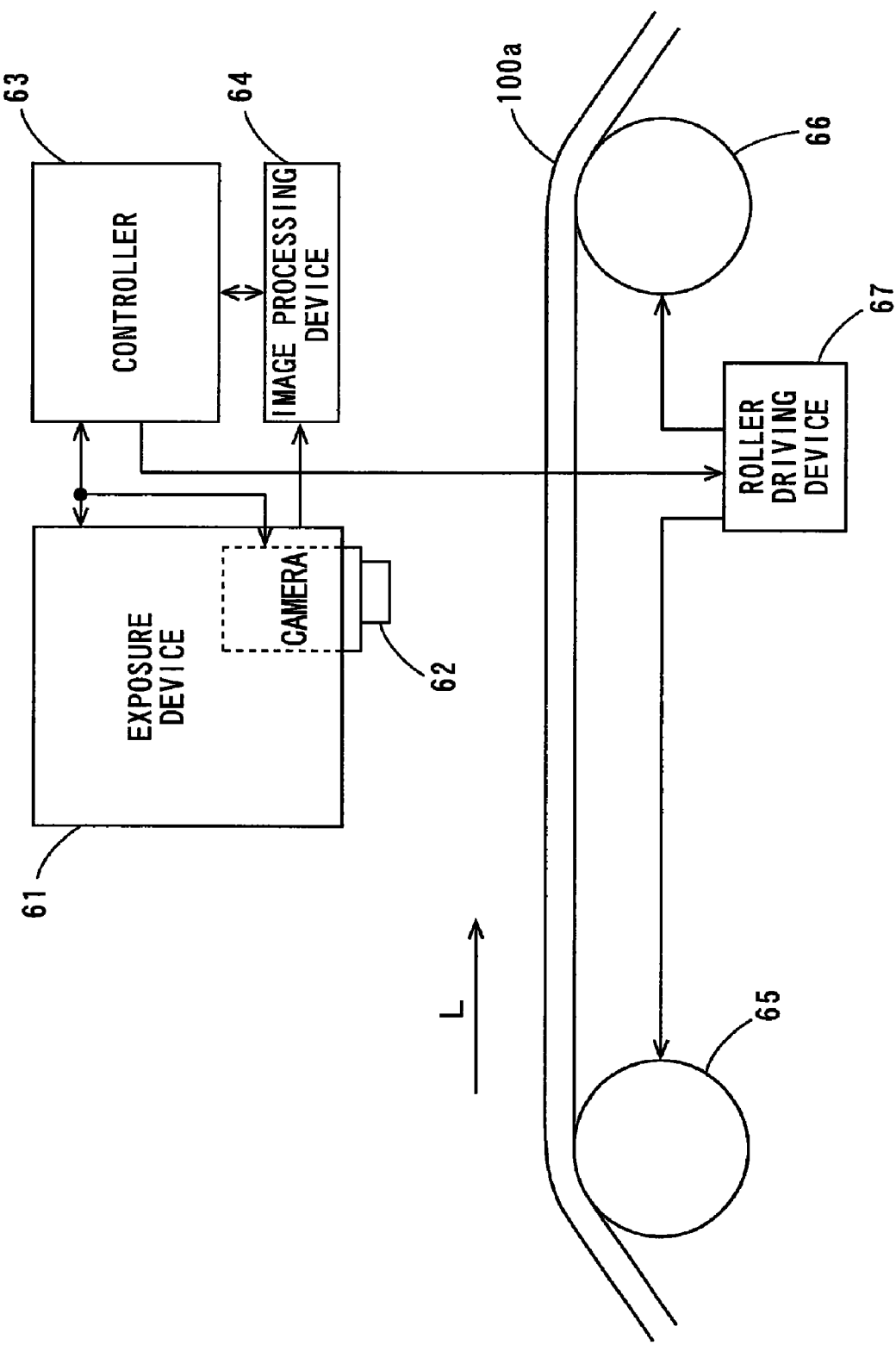
FIG. 14 is a block diagram showing the configuration of an exposure system used in exposure processing.

Next, description will be made of details of the exposure processing in the method of manufacturing the suspension board 1 according to the present embodiment. FIG. 14 is a block diagram showing the configuration of an exposure system used in the exposure processing.

The exposure system of FIG. 14 includes the exposure device 61, a plurality of cameras 62, a controller 63, an image processing device 64, transport rollers 65, 66 and a roller driving device 67.

The plurality of cameras 62 may be provided in the exposure device 61, or may be separately provided from the exposure device 61. FIG. 14 shows only one camera 62.

The image processing device 64 is composed of a personal computer and image processing software. The image processing device 64 subjects an image acquired from the cameras 62 to image processing, described below, and applies data obtained by the image processing to the controller 63. The controller 63 includes a CPU (Central Processing Unit) and a memory, or includes a microcomputer. The controller 63 controls the exposure device 61, the cameras 62, the image processing device 64 and the roller driving device 67, and acquires the data obtained by the image processing from the image processing device 64. While the image processing device 64 is separately provided from the controller 63 in the example of FIG. 14, the controller 63 may have the function of the image processing device 64.

The roller driving device 67 drives the transport rollers 65, 66. The long-sized base material 100a is transported by the transport rollers 65, 66.

The long-sized base material 100a is a laminate composed of the support substrate 10, the base insulating layer 11 and the resist layer R1 in the step of FIG. 8, and is a laminate composed of the support substrate 10, the base insulating layer 11, the conductor layer 12, the cover insulating layer 13 and the resist layer R2 in the step of FIG. 11.

Figure 15:
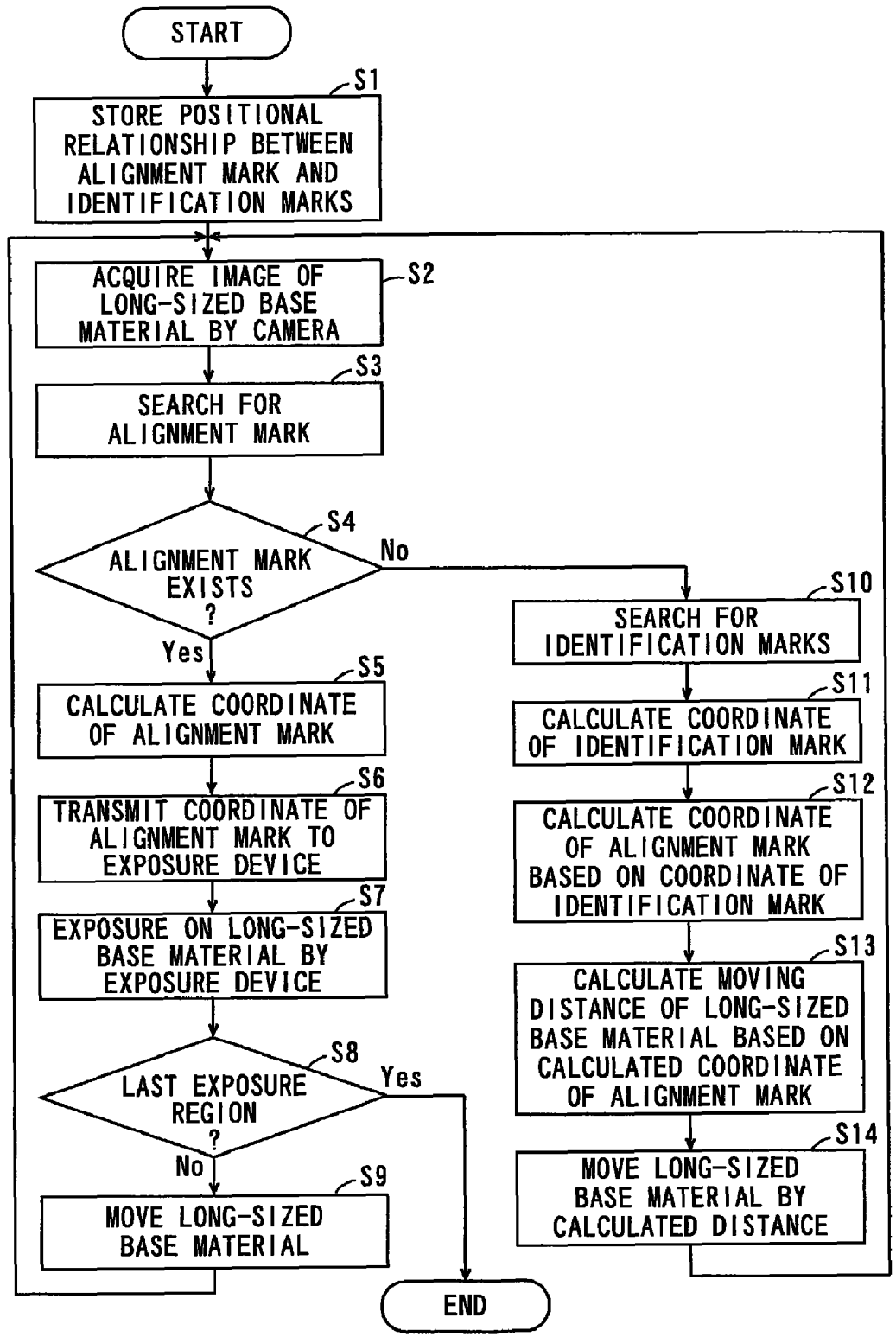
FIG. 15 is a flowchart showing operations of the exposure system of FIG. 14.
Figure 16:
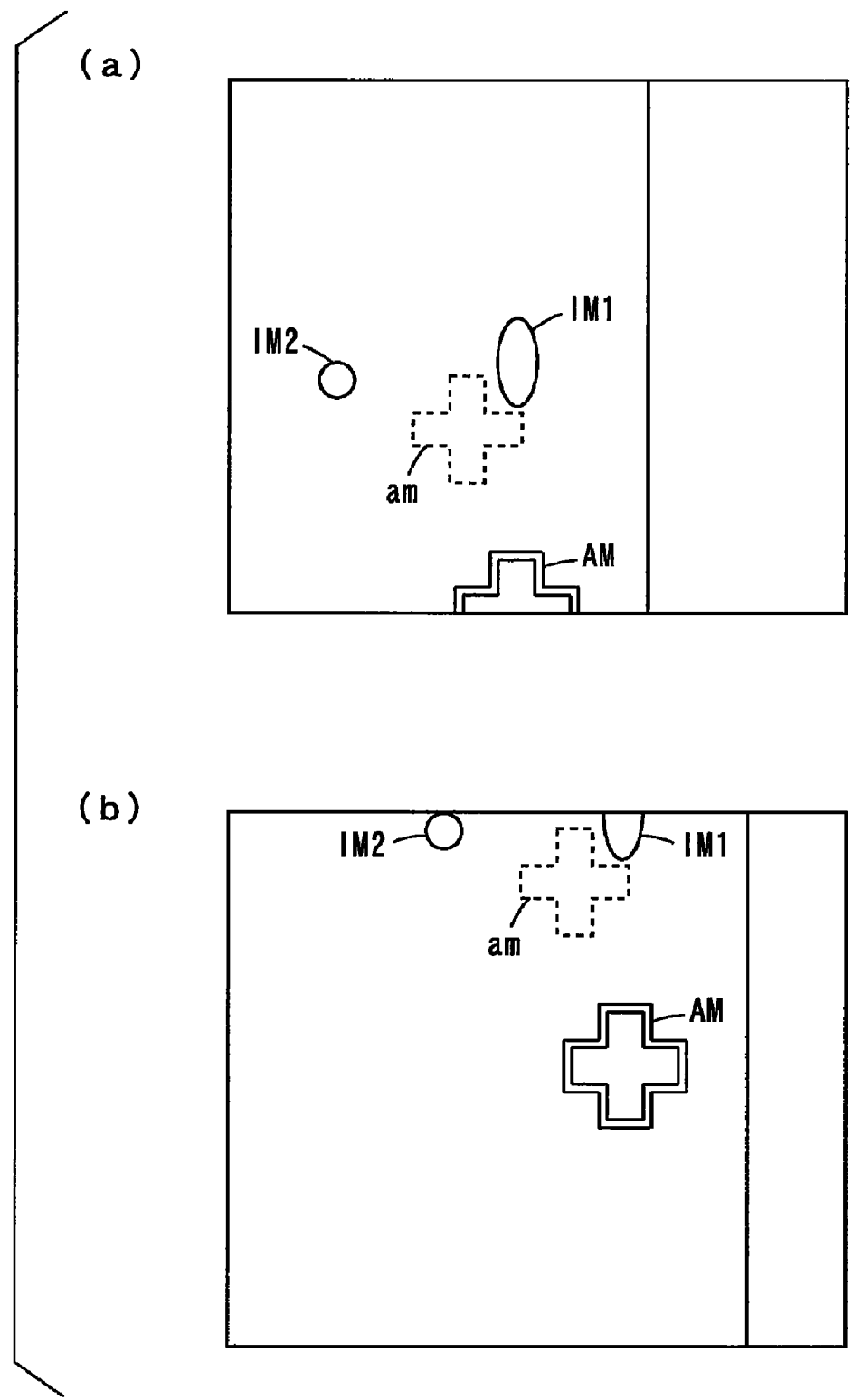
FIGS. 16 (a), (b) are diagrams showing examples of an image obtained by a camera.

Next, description will be made of operations of the exposure system of FIG. 14. FIG. 15 is a flowchart showing operations of the exposure system of FIG. 14. FIG. 16 is a diagram showing examples of the image obtained by the cameras 62. Here, the exposure processing shown in FIGS. 8 and 9 is described as an example. In the following paragraphs, an example of the processing using one of the plurality of cameras 62 is described.

The image processing device 64 of FIG. 14 previously stores the positional relationship between the alignment mark AM and the identification marks IM1, IM2, IM3 of FIG. 1 (Step S1). The positional relationship includes distances between the alignment mark AM and the identification marks IM1, IM2, IM3 in the transport direction on the long-sized base material 100a, distances between the alignment mark AM and the identification marks IM1, IM2, IM3 on the image acquired from the camera 62 and the relationship between the distances on the image acquired from the camera 62 and the distances on the long-sized base material 100a. Specifically, the relationship between the distances on the image and the distances on the long-sized base material 100a is an imaging magnification of the camera 62.

First, the image processing device 64 acquires the image of the long-sized base material 100a obtained by the camera 62 (Step S2).

Next, the image processing device 64 searches for the alignment mark AM on the image by pattern matching (Step S3), and determines whether or not the whole of the alignment mark AM exists within the area of the image (Step S4).

When the whole of the alignment mark AM exists within the area of the image, the image processing device 64 calculates the coordinate of the alignment mark AM on the image by the image processing (Step S5). The image processing device 64 applies the calculated coordinate of the alignment mark AM to the controller 63. Accordingly, the controller 63 transmits the coordinate of the alignment mark to the exposure device 61 (Step S6), and instructs the exposure device 61 to perform exposure on the long-sized base material 100a (Step S7).

The exposure device 61 aligns the first photomask based on the coordinate of the alignment mark AM transmitted by the controller 63. Before aligning the first photomask, the exposure device 61 searches for the identification mark formed in the first photomask on the image obtained by the camera 62. In this example, the identification mark IM1 is detected in the image obtained by the camera 62, so that the first photomask can be confirmed to be the photomask to be used in the exposure processing.

After aligning the first photomask, the exposure device 61 performs exposure on the exposure region EX of the long-sized base material 100a.

After that, the controller 63 determines whether or not the exposure that is just finished is the exposure on the last exposure region EX of the long-sized base material 100a (Step S8). When the exposure that is just finished is not the exposure on the last exposure region EX of the long-sized base material 100a, the controller 63 moves the long-sized base material 100a by controlling the roller driving device 67 such that the subsequent exposure region EX of the long-sized base material 100a is positioned below the exposure device 61 (Step S9). The controller 63 then instructs the image processing device 64 to return to the processing of Step S2.

When the whole or part of the alignment mark AM does not exist within the area of the image in Step S4, the image processing device 64 searches for the identification marks IM1, IM2, IM3 on the image by pattern matching (Step S10).

For example, part of the alignment mark AM, and the identification marks IM1, IM2 exist within the area of the image obtained by the camera 62 in the example of FIG. 16 (a). In this example, the image processing device 64 can detect the identification marks IM1, IM2 within the area of the image.

In this case, the image processing device 64 calculates the coordinate of the identification mark IM1 or the identification mark IM2 on the image by the image processing (Step S11). For example, the image processing device 64 calculates the Y coordinate (the coordinate in the transport direction of the long-sized base material 100a) at the center of the identification mark IM1 on the image. In this case, since the coordinate of the identification mark IM1 is used for calculating a distance by which the long-sized base material 100a is to be moved such that the alignment mark AM is positioned within the imaging area of the camera 62, the coordinate of the identification mark IM1 may be calculated at lower accuracy as compared with the coordinate of the alignment mark AM for aligning the photomask.

Further, the image processing device 64 calculates the coordinate of the alignment mark AM based on the calculated coordinate of the identification mark IM1 or the identification mark IM2 (Step S12). For example, the image processing device 64 calculates the Y coordinate at the center of the alignment mark AM based on the previously stored distance between the alignment mark AM and the identification mark IM1 on the image. In this case, since the alignment mark AM exists outside the area of the image, the coordinate of the alignment mark AM is in the outside of the area of the image.

Then, the image processing device 64 calculates the distance by which the long-sized base material 100a is to be moved for causing the alignment mark AM of the long-sized base material 100a to exist within the imaging area of the camera 62 based on the calculated coordinate of the alignment mark AM (Step S13).

For example, the image processing device 64 calculates the distance between the calculated Y coordinate at the center of the alignment mark AM and the Y coordinate at the given position in the image obtained by the camera 62, and calculates the distance by which the long-sized base material 100a is to be moved for causing the alignment mark AM of the long-sized base material 100 to be located at the given position within the imaging area of the camera 62 using the previously stored distance between the alignment mark AM and the identification mark IM1 on the long-sized base material 100a and the relationship between the distance on the image and the distance on the long-sized base material 100a. The image processing device 64 applies the calculated distance to the controller 63.

The controller 63 controls the roller driving device 67 to move the long-sized base material 100a by the distance calculated by the image processing device 64 (Step S14). The controller 63 subsequently instructs the image processing device 64 to return to the processing of Step S2.

In this manner, the whole of the alignment mark AM exists within the area of the image acquired from the camera 62 in Step S2 as shown in FIG. 16 (b). This allows the image processing device 64 to detect the whole of the alignment mark AM within the area of the image. Accordingly, the image processing device 64 calculates the coordinate of the alignment mark AM on the image (Step S5), the controller 63 transmits the coordinate of the alignment mark to the exposure device 61 (Step S6), and instructs the exposure device 61 to perform exposure on the long-sized base material 100a (Step S7).

An optical mark am is formed on the images of FIG. 16 by light passing through the cross-shaped opening, which is the alignment mark of the first photomask. The exposure device 61 adjusts the position of the first photomask such that the optical mark am coincides with the alignment mark AM. Accordingly, the first photomask is aligned with the exposure region EX of FIG. 1.

When the exposure that is just finished is the exposure on the last exposure region EX of the long-sized base material 100a in Step S8, the controller 63 finishes the exposure processing.

(5) Effects of the Embodiment

In the foregoing exposure processing, when the alignment mark AM does not exist within the area of the image obtained by the camera 62, the coordinate of the alignment mark AM is calculated based on the identification mark that exists within the area of the image and the previously stored positional relationship between the alignment mark AM and the identification mark. The distance by which the long-sized base material 100a is to be moved for causing the alignment mark AM to be positioned within the imaging area of the camera 62 is calculated based on the calculated coordinate of the alignment mark AM, and the long-sized base material 100a is moved by the calculated distance. Thus, the position of the alignment mark AM can be detected without reducing the imaging magnification of the camera 62 and repeatedly moving the long-sized base material 100a.

Accordingly, time required for detecting the position of the alignment mark AM can be shortened without reducing the detection accuracy of the position of the alignment mark AM. This results in shorter manufacturing time of the suspension board 1.

Since the identification mark for identifying the photomask is used for detecting the alignment mark AM, a mark need not be separately formed as a mark for searching. Accordingly, the alignment mark can be detected in a shorter time without increasing the number of the manufacturing steps of the printed circuit board.

Since the alignment mark AM and the identification marks IM1, IM2, IM3 are formed in the same step, the mark for searching can be formed without increasing the number of the manufacturing steps of the printed circuit board.

(6) Other Embodiments

While the two alignment marks AM are formed corresponding to each exposure region EX of the assembly sheet 100 in the above-described embodiment, the number of the alignment marks AM is not limited to two. One alignment mark AM or three or more alignment marks AM may be formed corresponding to each exposure region EX. The shape of the alignment mark AM is not limited to the cross shape. For example, the alignment mark AM may have any shape such as a round shape, a triangular shape or a quadrangular shape.

The number and shapes of the identification marks are not limited to those in the above-described embodiment. Each of the identification marks may have any shape such as a round shape, a triangular shape, a quadrangular shape, an elliptical shape or a cross shape.

While the identification marks IM1, IM2, IM3 for identifying the photomasks are used as the marks for searching for detecting the alignment mark AM in the above-described embodiment, the present invention is not limited to this. For example, any mark for searching that is not related to the photomask may be formed. Also in this case, the positional relationship between the alignment mark AM and the mark for searching is previously stored.

While the alignment mark AM and the identification marks IM1, IM2, IM3 are formed in the base insulating layer 11 in the above-described embodiment, the present invention is not limited to this. For example, the alignment mark AM and the identification marks may be formed in another layer. For example, the alignment mark AM and the identification marks may be formed in the support substrate 10 by a method such as punching.

While the alignment mark AM and the identification marks IM1, IM2, IM3 are formed in the same step in the above-described embodiment, the present invention is not limited to this. The alignment mark AM and the identification marks may be formed in different layers in different processes.

While description is made of the method of manufacturing the suspension board as an example of the method of manufacturing the printed circuit board in the above-described embodiment, the method of manufacturing the printed circuit board according to the present invention is also applicable to methods of manufacturing various printed circuit boards such as a flexible printed circuit board, a board for COF (Chip On Film) and a board for TAB (Tape Automated Bonding), not limited to the suspension board.

While the exposure device 61, the controller 63 and the image processing device 64 are separately provided from one another in the exposure system in the above-described embodiment, the controller 63 may have the function of the image processing device 64, and the image processing device 64 may have the function of the controller 63, as described above. The exposure device 61 may have the function of the controller 63, the exposure device 61 may have the function of the image processing device 64, and the exposure device 61 may have the functions of the controller 63 and the image processing device 64.

The method of detecting the alignment mark according to the present invention is applicable not only when the alignment mark is detected in the exposure processing in the manufacturing step of the printed circuit board, but also when the alignment mark is detected in exposure processing on any base material.

(7) Correspondences Between Elements in the Claims and Parts in Embodiments

In the following paragraphs, non-limiting examples of correspondences between various elements recited in the claims below and those described above with respect to various preferred embodiments of the present invention are explained.

The long-sized substrate 100a in the manufacturing process of the assembly sheet 100 is an example of a base material, the alignment mark AM is an example of an alignment mark, the identification marks IM1, IM2, IM3 are examples of a mark for searching or an identification mark, the identification mark IM1 is an example of a first identification mark, the identification mark IM2 is an example of a second identification mark, and the camera 62 is an example of an imaging device.

The exposure device 61 is an example of an exposure device, the suspension board 1 is an example of a printed circuit board, the base insulating layer 11 is an example of a first insulating layer, the conductor layer 12 is an example of a conductor layer, and the resist layers R1, R2 are examples of a photosensitive resist layer.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A method of detecting an alignment mark for aligning a photomask with an exposure region of a base material when said base material is subjected to exposure processing, wherein
said base material has said alignment mark, and has a mark for searching in a different position from a position of said alignment mark, and
said method comprises the steps of:
previously storing a positional relationship between said alignment mark and said mark for searching;
acquiring an image of said base material as a first image by photographing said base material by an imaging device;
calculating a distance by which said base material is to be moved for causing said alignment mark to exist within an imaging area of said imaging device based on the position of said mark for searching in said first image and said stored positional relationship when said alignment mark does not exist and said mark for searching exists in said acquired first image;
moving said base material by said calculated distance;
acquiring an image of said base material as a second image by said imaging device after said base material is moved; and
detecting the position of said alignment mark that exists in the acquired second image.

2. A method of manufacturing a printed circuit board including exposure processing for patterning any layer of a base material including a plurality of layers, comprising the steps of:
forming in said base material an alignment mark for aligning a photomask in an exposure device;
forming a mark for searching in a different position from a position of said alignment mark of said base material;
previously storing a positional relationship between said alignment mark and said mark for searching; and
performing said exposure processing on the any layer of said base material, wherein
said step of performing said exposure processing comprises the steps of:
acquiring an image of said base material as a first image by photographing said base material by an imaging device;
calculating a distance by which said base material is to be moved for causing said alignment mark to exist within an imaging area of said imaging device based on the position of said mark for searching in said first image and said stored positional relationship when said alignment mark does not exist and said mark for searching exists in said acquired first image;
moving said base material by said calculated distance;
acquiring an image of said base material as a second image by said imaging device after said base material is moved, and detecting the position of said alignment mark that exists in the acquired second image; and
applying said detected position of said alignment mark to said exposure device.

3. The method of manufacturing the printed circuit board according to claim 2, wherein said mark for searching includes an identification mark for identifying the photomask to be used in said exposure processing.

4. The method of manufacturing the printed circuit board according to claim 2, wherein
said printed circuit board includes a first insulating layer, a conductor layer and a second insulating layer in this order, and said base material includes at least a photosensitive resist layer, and
said exposure processing is performed on said photosensitive resist layer for patterning at least one of said first insulating layer, said conductor layer and said second insulating layer.

5. The method of manufacturing the printed circuit board according to claim 4, wherein
said base material includes at least said first insulating layer, and
said mark for searching includes a first identification mark corresponding to a first photomask to be used in the exposure processing for patterning said conductor layer.

6. The method of manufacturing the printed circuit board according to claim 3, wherein said base material includes at least said first insulating layer and said conductor layer, and said mark for searching includes a second identification mark corresponding to a second photomask to be used in the exposure processing for patterning said second insulating layer.

7. The method of manufacturing the printed circuit board according to claim 2, wherein said alignment mark has a first shape, and said mark for searching has a second shape that is different from said first shape.

* * * * *